(12) United States Patent
Link et al.

(10) Patent No.: US 10,230,343 B2
(45) Date of Patent: Mar. 12, 2019

(54) POWER SUPPLY FOR CLASS G AMPLIFIER

(71) Applicant: Avnera Corporation, Beaverton, OR (US)

(72) Inventors: Garry N. Link, Pacific City, OR (US); Eric King, San Jose, CA (US); Xudong Zhao, Portland, OR (US); Wai Lee, Portland, OR (US); Alexander C. Stange, Portland, OR (US); Amit Kumar, Beaverton, OR (US)

(73) Assignee: AVNERA CORPORATION, Beaverton, OR (US)

( * ) Notice: Subject to any disclaimer, the term of this patent is extended or adjusted under 35 U.S.C. 154(b) by 0 days.

(21) Appl. No.: 15/858,101

(22) Filed: Dec. 29, 2017

(65) Prior Publication Data

US 2018/0198430 A1    Jul. 12, 2018

Related U.S. Application Data

(60) Provisional application No. 62/443,573, filed on Jan. 6, 2017.

(51) Int. Cl.
| | |
|---|---|
| H03G 3/00 | (2006.01) |
| H03G 3/32 | (2006.01) |
| H03F 1/02 | (2006.01) |
| H03F 1/30 | (2006.01) |
| H03F 3/187 | (2006.01) |

(52) U.S. Cl.
CPC ............ *H03G 3/004* (2013.01); *H03F 1/025* (2013.01); *H03F 1/305* (2013.01); *H03F 3/187* (2013.01); *H03G 3/32* (2013.01); *H03F 2200/507* (2013.01); *H03F 2200/511* (2013.01)

(58) Field of Classification Search
USPC ................... 330/297, 136, 251, 127, 279
See application file for complete search history.

(56) References Cited

U.S. PATENT DOCUMENTS

| | | | |
|---|---|---|---|
| 7,031,457 B2 * | 4/2006 | Melsa | H03F 1/025 330/297 |
| 7,830,209 B1 | 11/2010 | Woodford et al. | |
| 8,072,266 B1 | 12/2011 | Hoomes et al. | |

(Continued)

OTHER PUBLICATIONS

International Search Report and Written Opinion issued in International Application No. PCT/US2017/069066, dated Mar. 21, 2018, 11 pages.

(Continued)

*Primary Examiner* — Hieu Nguyen
(74) *Attorney, Agent, or Firm* — Miller Nash Graham & Dunn, LLP

(57) ABSTRACT

A Class G amplifier system including a processing unit configured to receive an input signal and output a delayed processed input signal, a class G amplifier configured to receive the delayed processed input signal, and a power supply. The power supply includes a regulator configured to operate in a plurality of configurations, each configuration outputs a different supply voltage to the class G amplifier and a control circuit configured to receive the input signal and determine the supply voltage required from the regulator when the delayed processed input signal is received at the class G amplifier, and output a signal to the regulator to indicate the required configuration for the required supply voltage.

15 Claims, 14 Drawing Sheets

(56) References Cited

U.S. PATENT DOCUMENTS

| | | |
|---|---|---|
| 8,169,261 B2 | 5/2012 | Wilson |
| 8,310,313 B2 * | 11/2012 | Guo .................... H03F 1/0244 |
| | | 330/207 P |
| 2008/0044041 A1 | 2/2008 | Tucker et al. |
| 2010/0097148 A1 | 4/2010 | Ye et al. |
| 2014/0159816 A1 | 6/2014 | Lesso |

OTHER PUBLICATIONS

Taiwan IPO Search Report issued in Taiwan Patent Application No. 107100470, dated Jul. 30, 2018, 1 page.

* cited by examiner

POWER SUPPLY FOR CLASS G AMPLIFIER

CROSS-REFERENCE TO RELATED APPLICATIONS

This application claims the benefit of U.S. Provisional Patent Application No. 62/443,573, filed Jan. 6, 2017 and entitled "POWER SUPPLY FOR CLASS G AMPLIFIER," the disclosure of which is incorporated herein by reference in its entirety.

TECHNICAL FIELD

This disclosure relates to a power supply for a class G amplifier including a regulator and a controller configured to operate the regulator based on an input signal.

BACKGROUND

Class G amplifiers refer to the class of amplifiers that dynamically switch supply voltages to improve on the amplifier's power efficiency. The Class G amplifiers are a modification of another class of amplifier (normally Class B or Class AB) to increase efficiency and reduce power dissipation. Class G amplifiers take advantage of the fact that musical and voice signals have a high crest factor with most of the signal content at lower amplitudes. Conventional Class G amplifiers use multiple power supplies, operating from the power rail that provides the optimum power dissipation.

A Class G amplifier uses a minimum of two different supply rails. The device operates from the lower supply until a higher supply is needed. At this point the device switches the output stage to the higher supply rail. Once the output signal drops below a predetermined level, the device switches back to the lower rail.

There are a number of trade-offs associated with Class G amplifiers: selecting the proper number of supplies and the voltage difference between the supplies to optimize at lower voltages, while minimizing power dissipation. Two different rails minimize the complexity of the power supplies, while providing sufficient voltage flexibility. Additional rails may reduce power dissipation further but at the cost of higher component count, complexity, and reliability. Another issue is the length of time the device operates from the higher rail. While operating from the higher supply rail, power dissipation increases. Switching back to the lower rail too early may result in distortion due to clipping, while remaining at the higher rail for an extended period of time will result in a degradation of efficiency.

Embodiments of the invention address these and other limitations in the prior art.

DETAILED DESCRIPTION

Figure 1:
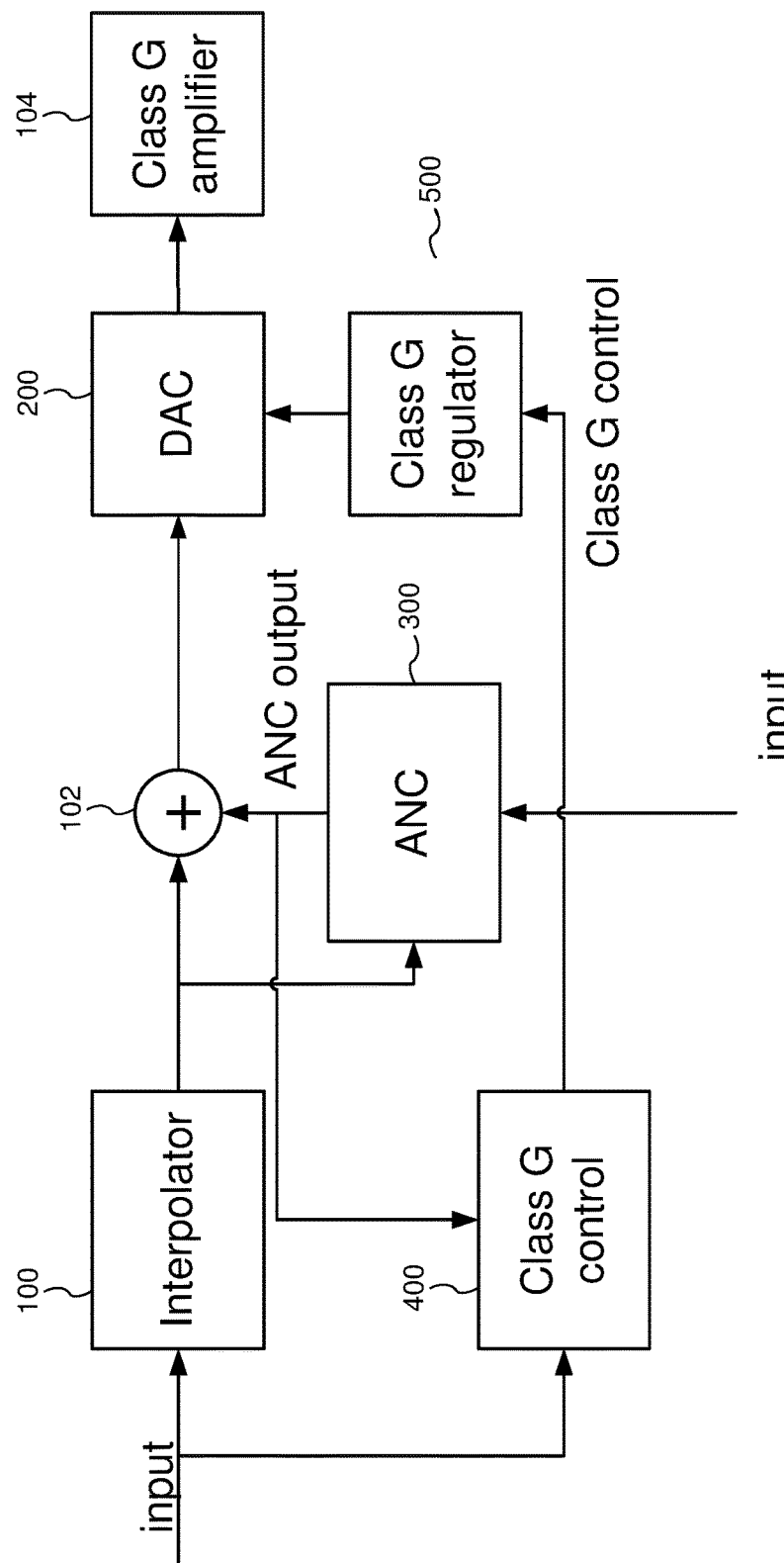
FIG. 1 illustrates a block diagram of a class G amplifier system according to the disclosed technology.

FIG. 1 illustrates a block diagram of a system of the disclosed technology according to some embodiments. The interpolator 100 and digital-to-analog converter (DAC) 200 are part of a conventional audio DAC design. The output from the DAC 200 is sent to a Class G amplifier 104. Active Noise Cancellation (ANC) 300 is a digital signal processing circuit to produce a noise cancellation signal that is fed to the DAC 104. Both the interpolator 100 and the ANC 300 receive an audio input signal, and the ANC 300 also receive an input from the interpolator 100. The output from the interpolator 100 is mixed through a summer 102 with the output of the ANC 300 before being fed to the DAC 200.

The Class G control circuit 400 takes as an input the audio input signal and the ANC 300 output, makes decisions on the anticipated signal conditions, and outputs signals to control the Class G regulator 500, which will be discussed in more detail below. The Class G control circuit takes advantage of the delay through the interpolator 100 to make decisions before the audio signal reaches the DAC 200. The Class G regulator 500 is an analog circuit that produces the power supply voltages for the Class G amplifier 104. Because it takes time for the Class G regulator 500 to settle to new output voltage settings, the Class G control circuit 400 anticipates the demands on the audio power supply voltage and builds in margins so the Class G amplifier 104 will not clip on an insufficient supply voltage.

Figure 2:
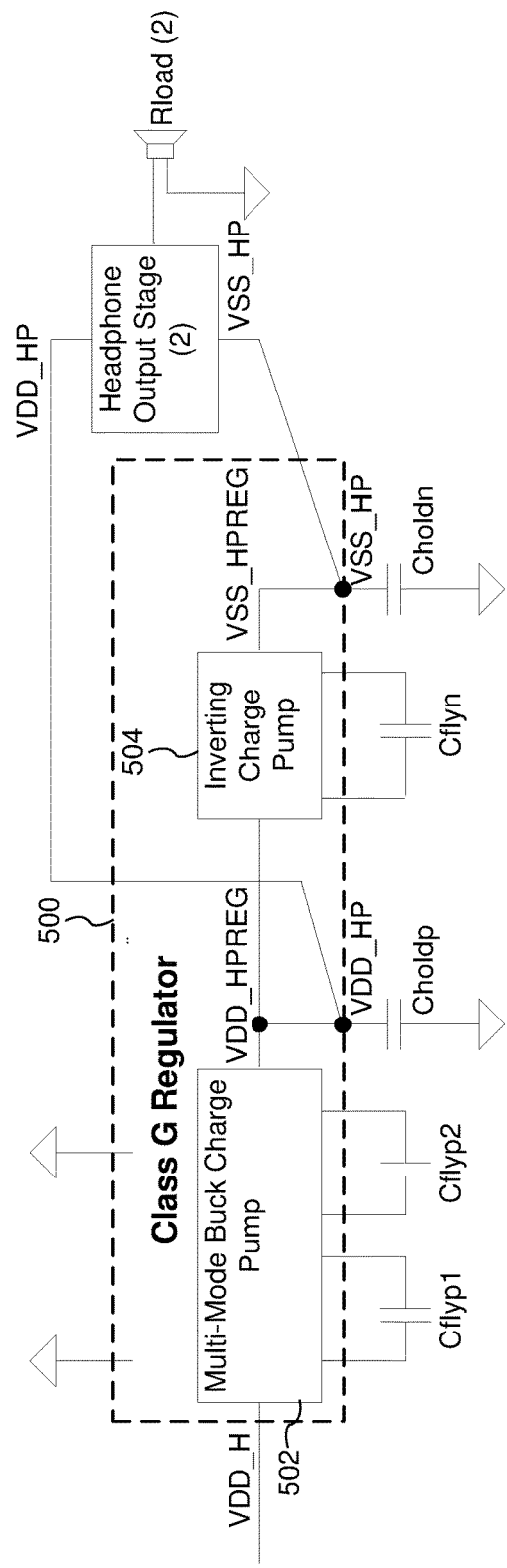
FIG. 2 illustrates a block diagram of the headphone regulator of FIG. 1.

FIG. 2 illustrates the Class G regulator 500. The Class G regulator 500 is a charge pump converter with configurable discrete output voltages. The Class G regulator 500 includes a multi-mode buck charge pump 502 and an inverting charge pump 504, each of which will be discussed in more detail below.

Figure 3:
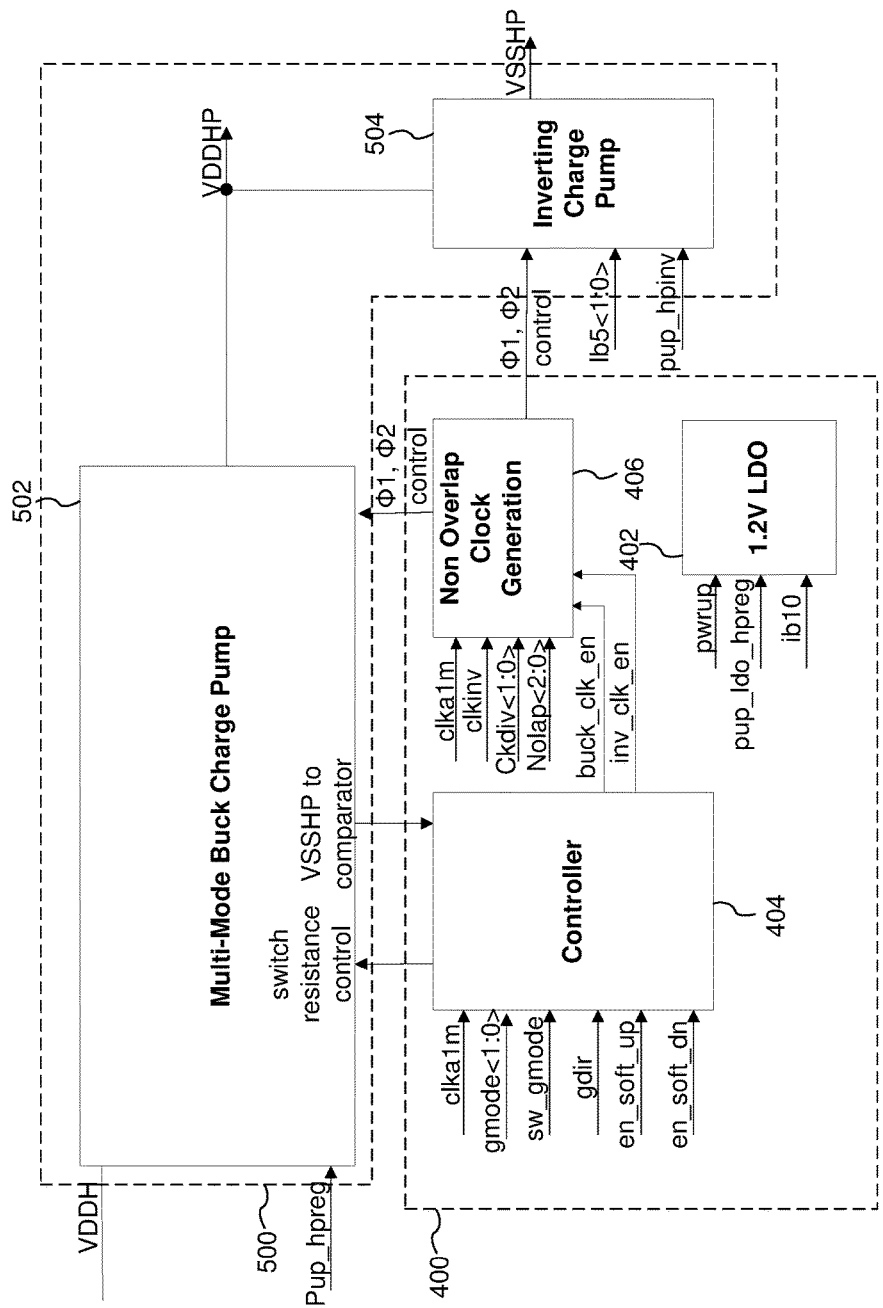
FIG. 3 illustrates a more detailed block diagram of the headphone regulator of FIG. 1.

FIG. 3 illustrates the Class G control system that creates a bipolar supply for the Class G amplifier 104 from the 2.7V to 3.6V power supply (not shown). The Class G regulator 500 creates the bipolar supply from the input rail VDDHP using the buck charge pump 502 for a positive voltage rail and the inverting charge pump 504 for the negative voltage rail. Both the buck charge pump 502 and the charge pump inverter 504 are unregulated, so the output circuitry should provide power supply rejection. The Class G control circuit 400 includes a low dropout voltage regulator 402, a controller 404, a comparator (not shown) to determine when the buck charge pump 402 has reached the desired value on falling transitions, a non-overlap clock generator 406 to generate clock signals for both the buck charge pump 502 and charge pump inverter 504, which will be discussed in more detail below.

The buck charge pump 502 uses two fly capacitors cflyp1 and cflyp2 in three different configurations, shown in FIGS. 4-6, to implement 1.5:1, 2:1, and 3:1 modes to provide discrete Class G operation, which will be discussed in more detail below. With a nominal input voltage of 3.3V, the 1.5:1, 2:1, and 3:1 modes result in an output at VDDHP of 2.2V, 1.65V, and 1.1V, respectively.

To minimize the number of switches 202 required for the different modes, switches 202 may be shared between modes where possible by selectively controlling the non-overlap phase signals to the switches 202. As seen in FIGS. 4-6, the buck converter 502 includes nine switches 202 to make the desired connections for the various modes. FIGS. 4-6 show the fly capacitors cflyp1 and cflyp2 connections during the charge phase (φ1) and the discharge phase (φ2), along with a circuit diagram indicating which switches 202 are used during the two phases (marked with either φ1 or φ2) to create the desired connections.

The switches 202 marked φ1 are closed during the charging phase, while the switches 202 marked φ2 are open during this phase. During the discharge phase, switches 202 marked φ1 are open and switches marked φ2 are closed.

Figure 4:
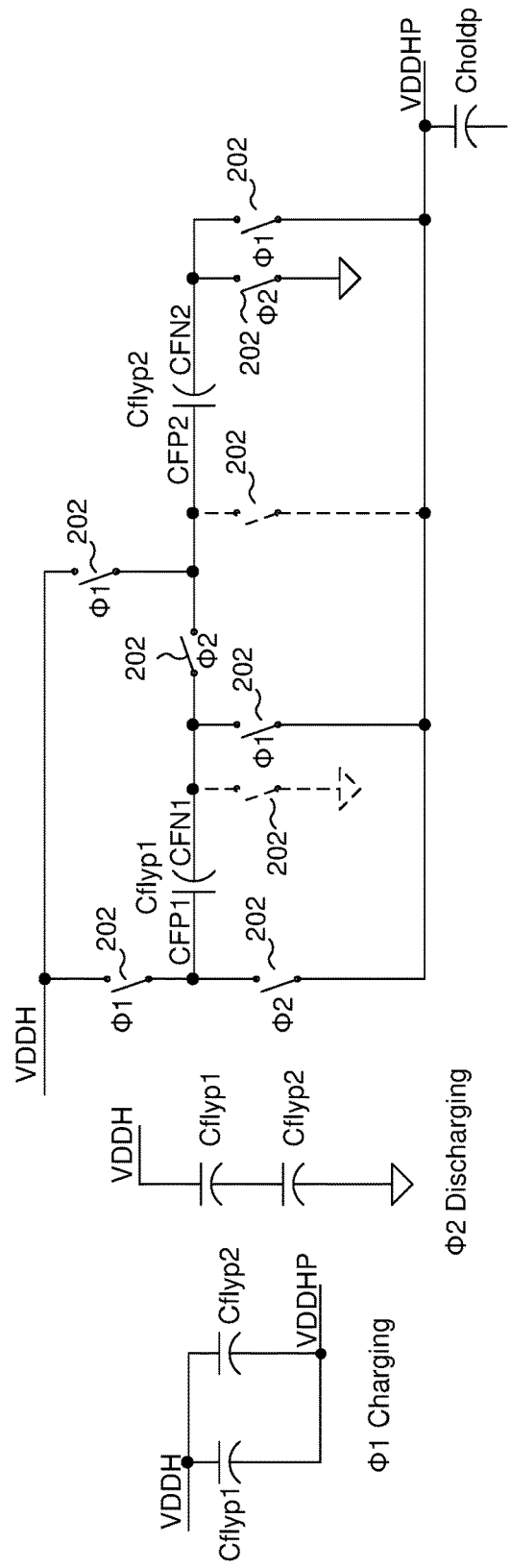
FIG. 4 illustrates the configuration of the buck charge pump shown in FIGS. 2 and 3 for a 1.5:1 mode for a charging and a discharging phase.
Figure 5:
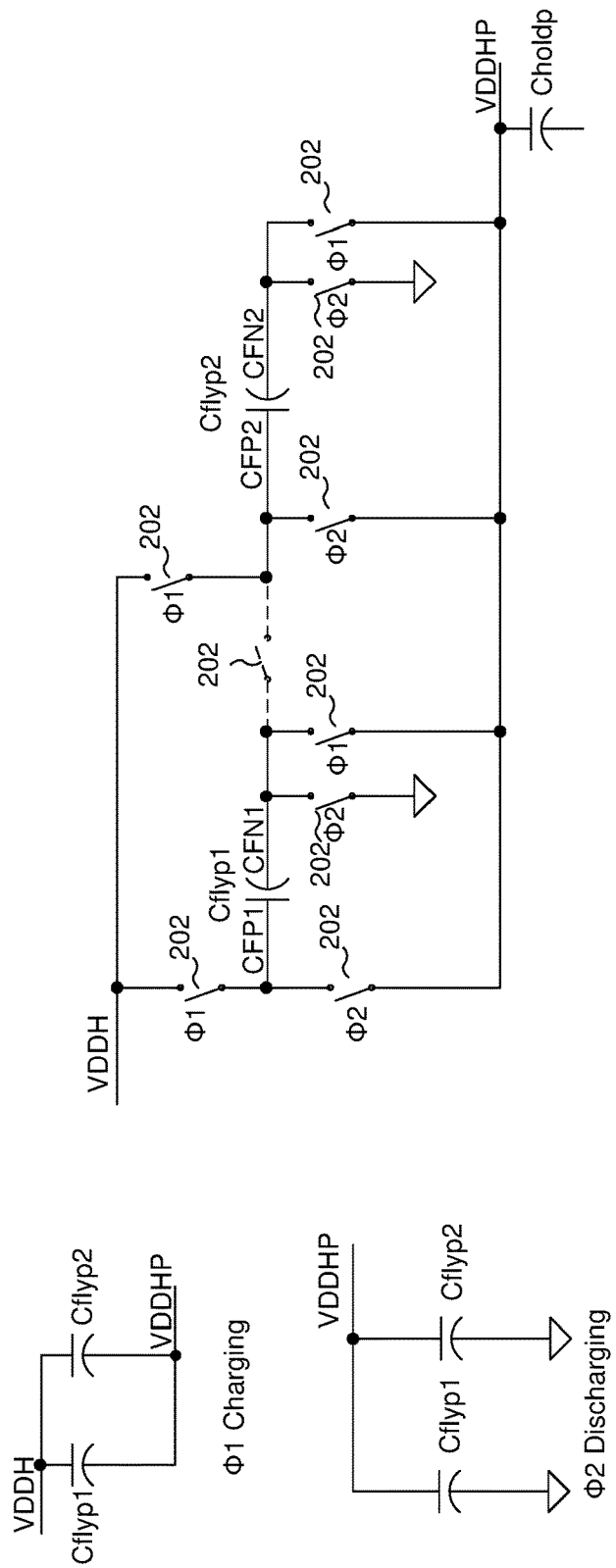
FIG. 5 illustrates the configuration of the buck charge pump shown in FIGS. 2 and 3 for a 2:1 mode for a charging and a discharging phase.
Figure 6:
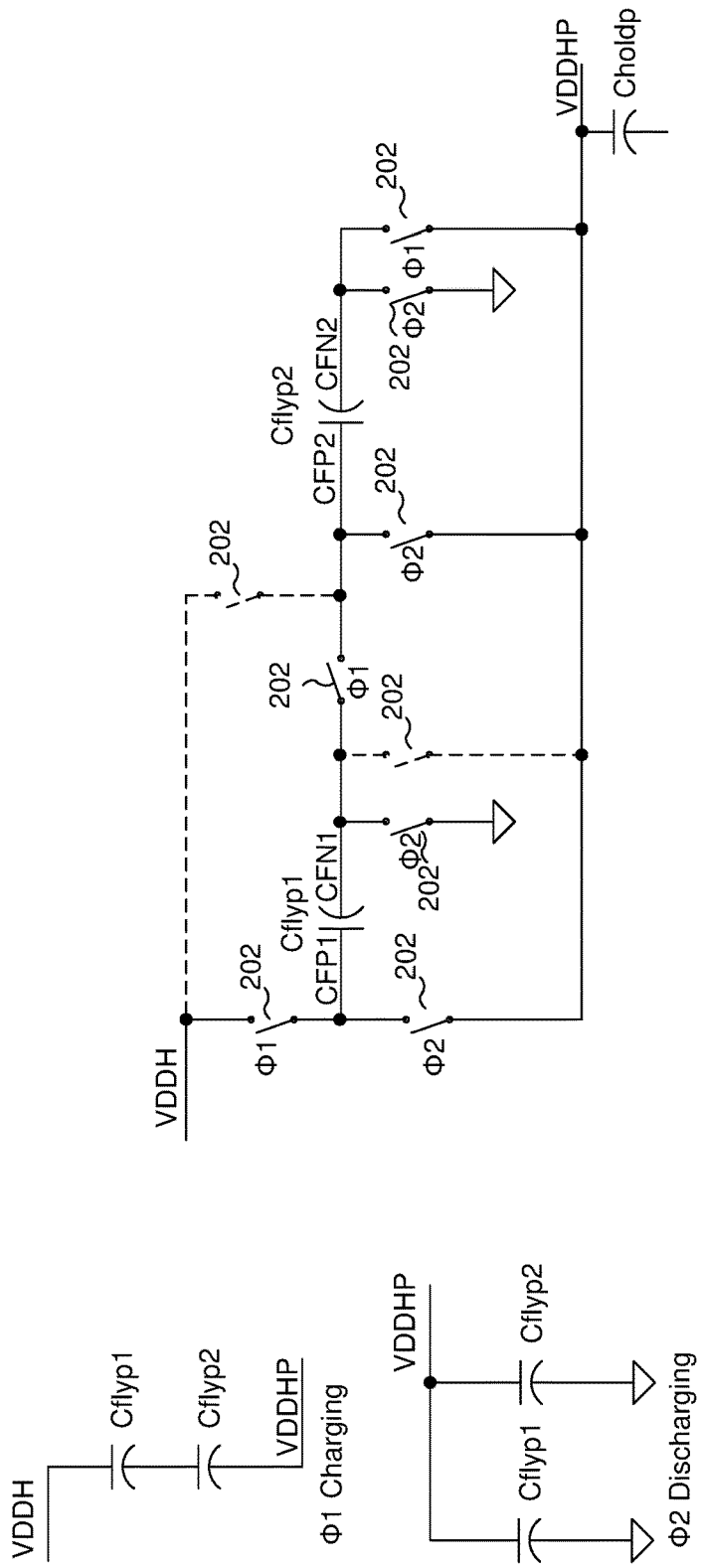
FIG. 6 illustrates the configuration of the buck charge pump shown in FIGS. 2 and 3 for a 3:1 mode for a charging and a discharging phase.

FIG. 4 illustrates the configuration of the buck charge pump 502 for a 1.5:1 mode, FIG. 5 illustrates the configuration of the buck charge pump 502 for the 2:1 mode, and FIG. 6 illustrates the configuration of the buck charge pump 502 for the 3:1 mode.

Figure 7:
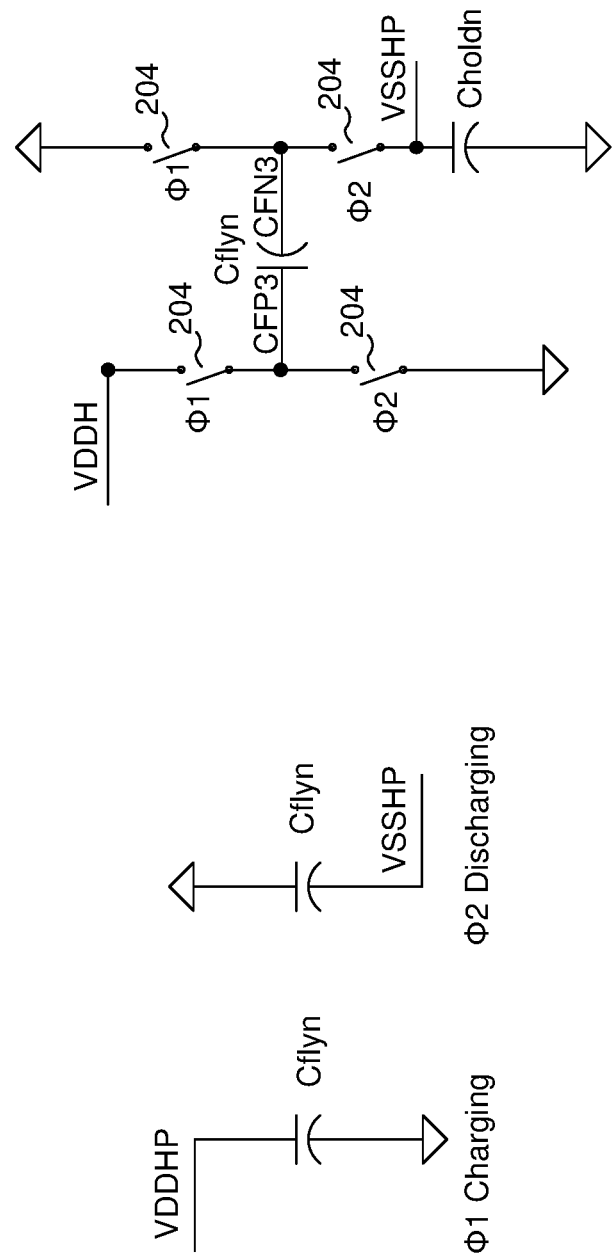
FIG. 7 illustrates the configuration of the inverting charge pump shown in FIGS. 2 and 3 for a charging and discharging phase.

The charge pump inverter 504 has a configuration as shown in FIG. 7, charging the fly capacitor cflyn during the charge phase φ1 and discharging the fly capacitor cflyn during the discharge phase φ2. As with FIGS. 4-6, FIG. 7 shows the fly capacitor cflyn configuration in the charging phase φ1 and discharging phase φ2. Switches 204 marked φ1 are closed during charging, while switches 204 marked φ2 are open. During discharging, switches 204 marked φ1 are open and switches marked φ2 are closed.

With respect to FIGS. 4-7, the dotted switches 202 and 204 are switches that remain open during both the charge and discharge phase for the various modes.

Figure 8:
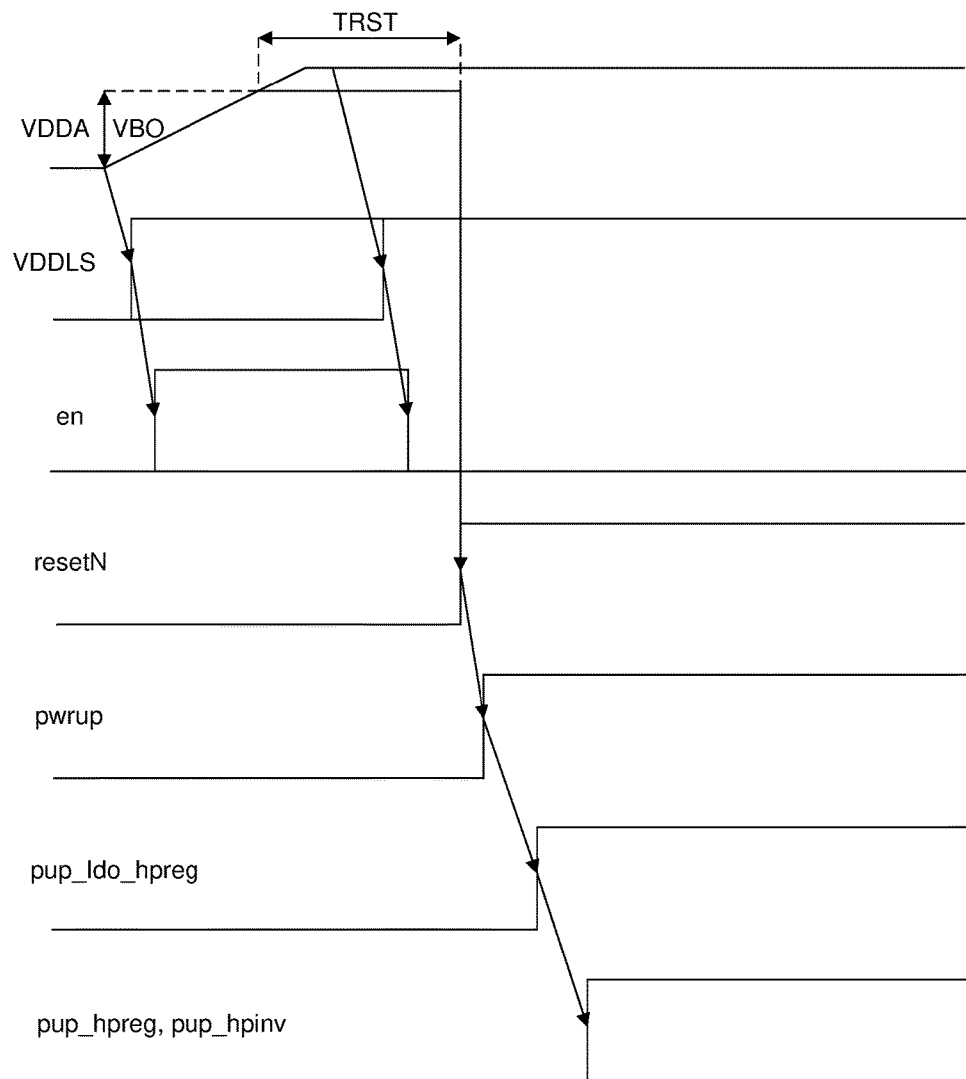
FIG. 8 illustrates a timing chart for an initialization of the class G control system.

At initialization, the Class G system generally follows the diagram shown in FIG. 8.

As discussed above, the buck converter 502 operates in three modes. The buck converter 502 also has four possible states: 00, 01, 11, and 10. After initialization, the buck converter 502 will be in the 00 state, which is equal to the 3:1 mode with the clock disabled. Since the Class G mode selections are gray coded, a single mode control signal will change during each transition. The allowable Class G mode transitions are shown in table 1 below:

TABLE 1

| Mode before transition | Transition to 00 | Transition to 01 | Transition to 11 | Transition to 10 |
| --- | --- | --- | --- | --- |
| 00 - Clock disabled, 3:1 mode | — | Increasing | Not Allowed | Not Allowed |
| 01 - 3:1 mode | Decreasing | — | Increasing | Not Allowed |
| 11 - 2:1 mode | Not Allowed | Decreasing | — | Increasing |
| 10 - 1.5:1 mode | Not Allowed | Not Allowed | Decreasing | — |

Figure 9:
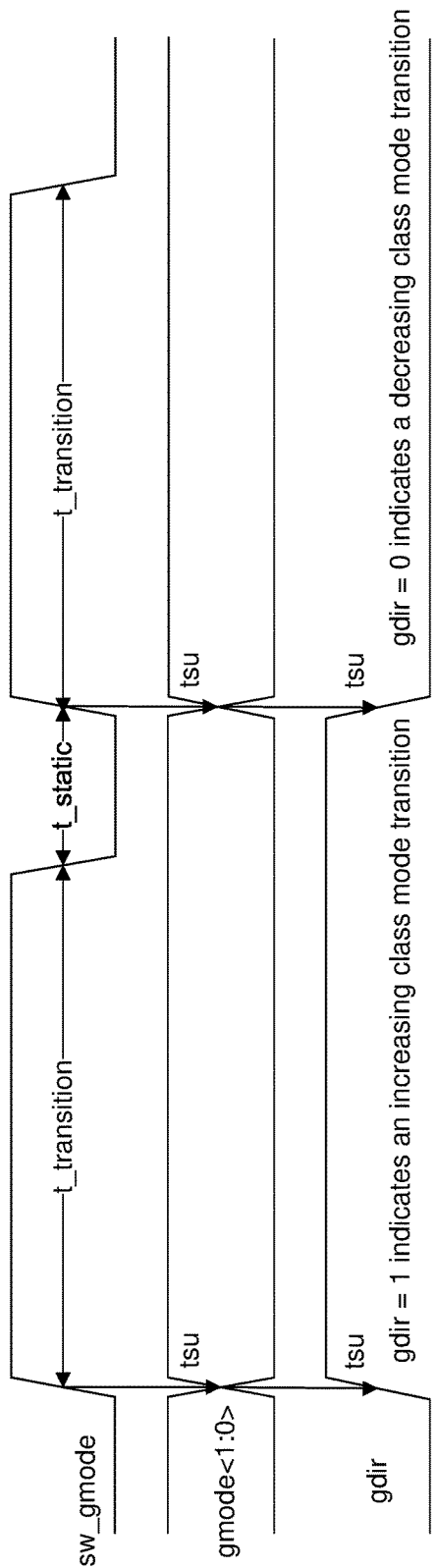
FIG. 9 illustrates a timing chart for class G control signal timing of the class G control system.

There are four control signals that are configured to initiate a Class G mode transition, sw_gmode, gmode<1:0>, and gdir, as shown in FIG. 3. FIG. 9 illustrates a timing chart based on the four control signals. The mode transition is initiated on the rising edge of sw_gmode. The transitions of the control signals gmode<1.0> and gdir are nominally coincident with the rising edge of sw_gmode. In FIG. 9, the time interval tsu is the set up time relative to the rising edge of sw_gmode. The time interval t_transition is the width of the positive sw_gmode signal needed to complete a transition, while the time interval t_static is the width of the negative sw_gmode signal needed before the next transition.

Mode 00 is only used for the start of the operation. The buck charge pump 502 starts in this mode to initialize and then immediately transitions to mode 01. Mode 01 tolerates ½ full scale signals while mode 11 tolerates signals that are ¾ full scale. Signals higher than ¾ full scale stay in state 10.

As mentioned above and shown in FIG. 9, there are two time intervals for each mode transition. The time interval t_transition is the time the transition signal holds high during a mode change. The time interval t_static is the minimal time between the end of the t_transition signal and the start of the next mode change. T_transition has a specification minimum of 150 µs and is typically 200 µs. T_static has a specification minimum of 20 µs and typically is 1800 µs.

To avoid signal clipping, two consecutive mode increases must be performed before the large signal hits the Class G regulator 500. If t_transition is 200 µs and t_static is µs, such two mode increases take 420 µs to complete. Therefore, the large signal must be detected 420 µs ahead of time so the buck charge pump 502 has enough time to change states. The interpolator 100 has a built in adjustable group latency between 600 µs to 1000 µs from 48 KHz to 384 KHz, so the requirement for the input signal perspective may be met. As shown in FIG. 1, the input signal is sent both to the interpolator 100 and the Class G control circuit 400. Therefore, while the input signal is processed and delayed in the interpolator 100, the Class G control circuit 400 detects the signal amplitude and controls the buck charge pump 502, as needed, to be in the correct mode for that input signal amplitude. That is, the Class G Control circuit 400 looks ahead at the incoming signal to adjust the mode of the buck charge pump 502 as needed and allow the buck charge pump 502 voltage to settle before the signal is received at the Class G amplifier 200.

Figure 10:
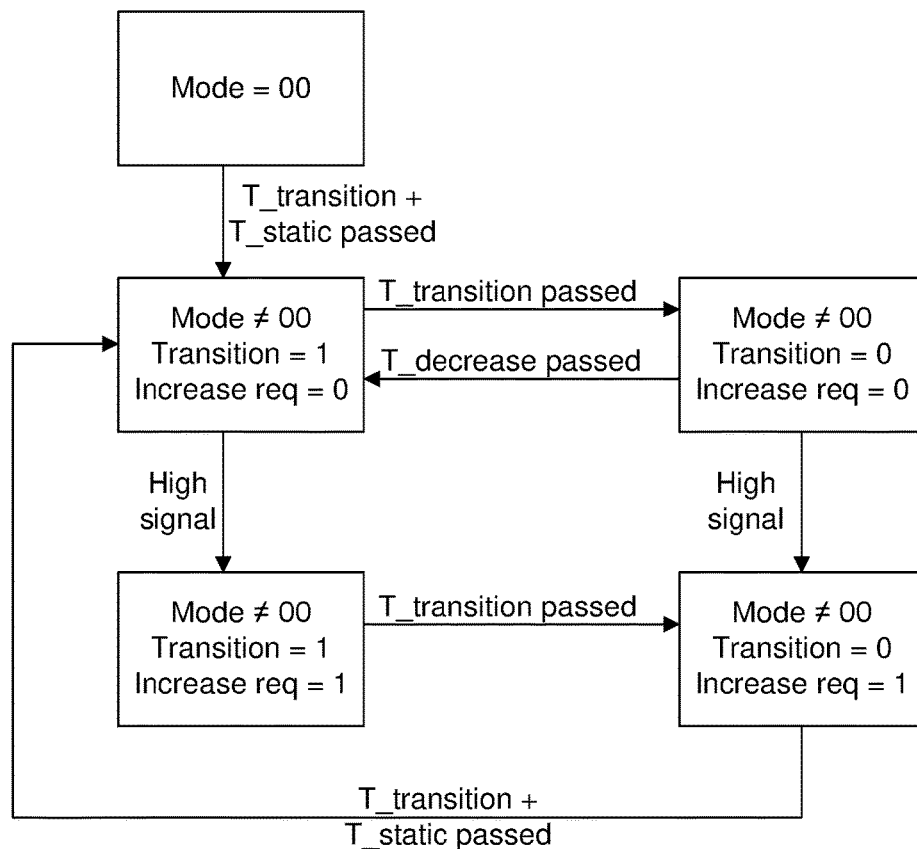
FIG. 10 illustrates a state diagram for class G control timing of the class G control system.

There are four inputs to the Class G control circuit 400, an input sample of two channels and an ANC 300 output of two channels. The output of the Class G control circuit 400 has four bits: two for mode control, one for transition and one for increase. FIG. 10 shows a state diagram for controlling the buck charge pump 502. At start up, the buck charge pump 502 starts in mode 00. It stays at mode 00 for t_transition time period plus t_static time period before beginning a transition to mode φ1.

At the beginning of each transition, the transition bit is set to high and the increase bit is set to 0 or 1 depending on an increase or decrease in mode. The mode bits are set to the new mode. The transition bit and increase bit hold their value for t_transition time period. After that time period, both bits go to 0. When a high signal is detected, i.e., a signal level above a threshold, a countdown starts for increasing the mode. At the end of the countdown, a new transition begins, as needed. A countdown for decreasing the mode starts as long as the signal is below a threshold. If the signal is above the threshold, the countdown restarts. If the countdown reaches its end, a new transition begins as needed.

The countdowns and thresholds for increasing and decreasing are programmable. The time intervals are 8 bit values with units of 48 KHz sample period. The threshold constants depend on mode and are also 8 bit values with unit $2^{-8}$ full scale.

There are two counters (not shown) for the transition time and the countdown time. The counters are managed as discussed in detail above. One register bit is used to indicate the detection of a large signal and for waiting for mode increase. The controller 404 can program the maximal mode and the minimal mode. Further, an enable bit may be set by the controller 404 so the mode stays in the maximal mode and never changes.

The main components of the counters are two 20 bit counters, approximately 15 adders, and approximately 10 comparators. Therefore, the amount of hardware is limited. Further, the current is also very small. The total number of flip flops is less than 100. The clock rate can be as low as 384 KHz. The current consumption then should be less than 0.1 mA.

To avoid clipping when the audio signal increases across a mode threshold level, the audio signal should be buffered sufficiently to allow the buck charge pump 502 to reach the new level before the audio increases. For example, as discussed above, the audio input signal is buffered in the interpolator 100. For a decreasing transition, the mode may be changed immediately, but the signal must remain below the threshold of the new Class G mode long enough to return to the higher initial mode.

Figure 11:
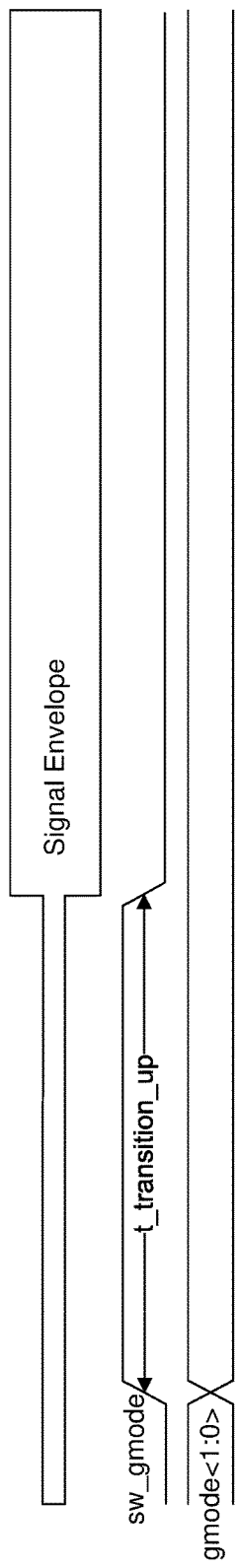
FIG. 11 illustrates a first timing diagram for class G control timing according to various signal conditions for the class G control system.

FIGS. 11-16 show the timing constraints for several of the possible Class G mode transitions as the envelope of the audio signal changes. FIG. 11 shows an abrupt increase in amplitude across one threshold. As can be seen in FIG. 11, the sw_gmode signal goes high for t_transition time period to allow the buck charge pump 502 to change modes for the upcoming signal envelope. The buck charge pump 502 is then in the new mode when the signal with the increased amplitude is received.

Figure 12:
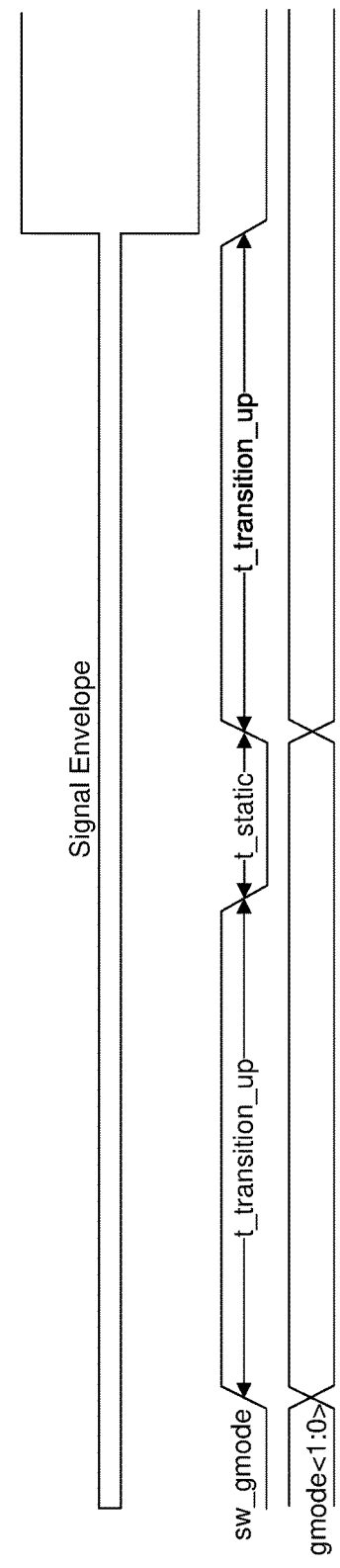
FIG. 12 illustrates a second timing diagram for class G control timing according to various signal conditions for the class G control system.

FIG. 12 illustrates an abrupt increase in amplitude across two thresholds. Again, the sw_gmode signal goes high to initiate the transition of modes for the buck charge pump 502. In FIG. 12, it can be seen that the signal envelop is greater than in FIG. 11, so two transitions are required for the buck charge pump 502. That is, sw_gmode goes high for a t_transition time period to allow for a mode change, is low during the t_static time period, and then goes high again for a t_transition time period to allow for another mode change prior to the signal envelope going high.

Figure 13:
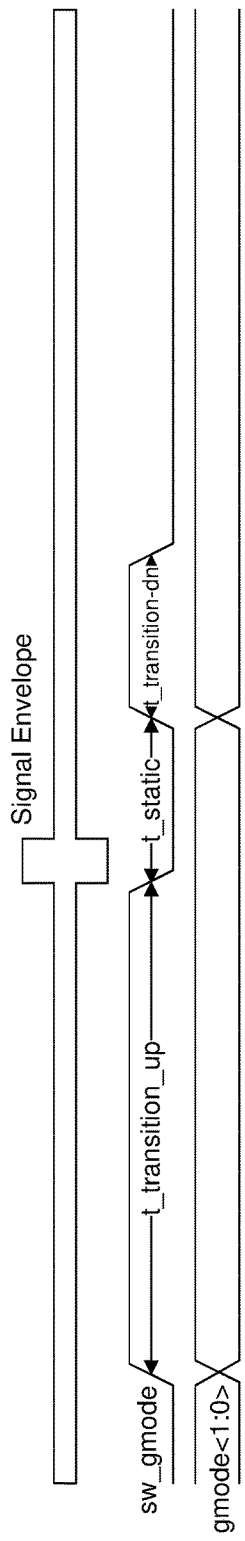
FIG. 13 illustrates a third timing diagram for class G control timing according to various signal conditions for the class G control system.

FIG. 13 illustrates an abrupt increase in amplitude across one threshold, then an abrupt decrease. As can be seen in FIG. 13, sw_gmode again goes high to initiate the transition. Sw_gmode stays high for the t_transition period to change modes, and then goes low for the t_static time period. However, the signal envelope then has an abrupt decrease, so the sw_gmode goes high again for a t_transition period, which is less than the first t_transition period, for the mode to decrease. It takes less time for the mode to decrease than increase, so the second t_transition period is smaller than the first t_transition period.

Figure 14:
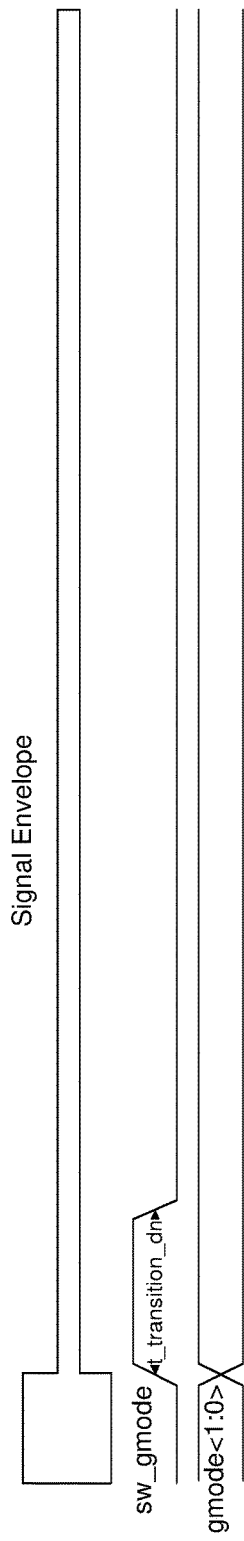
FIG. 14 illustrates a fourth timing diagram for class G control timing according to various signal conditions for the class G control system.

FIG. 14 illustrates an abrupt decrease in amplitude across one threshold. Similar to FIG. 11, sw_gmode goes high to start the transition. However, in FIG. 14, the signal envelope has decreased, the so the t_transition time period is shorter to allow the buck charge pump 502 to decrease in modes.

Figure 15:
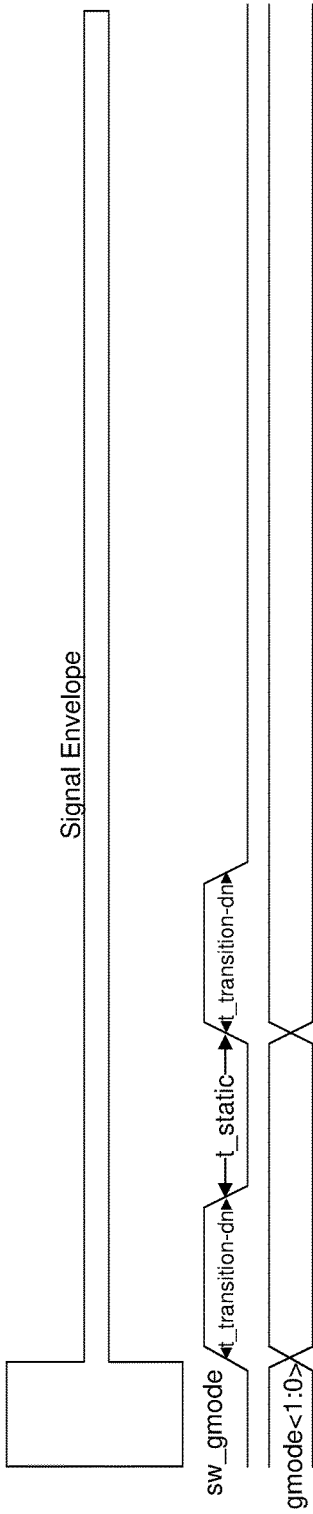
FIG. 15 illustrates a fifth timing diagram for class G control timing according to various signal conditions for the class G control system.

FIG. 15 illustrates an abrupt decrease in amplitude across two thresholds. Similar to FIG. 12, sw_gmode goes high to start the transition. Here, there is a large decrease in the signal envelope, so the buck charge pump 502 must change through two transitions.

Figure 16:
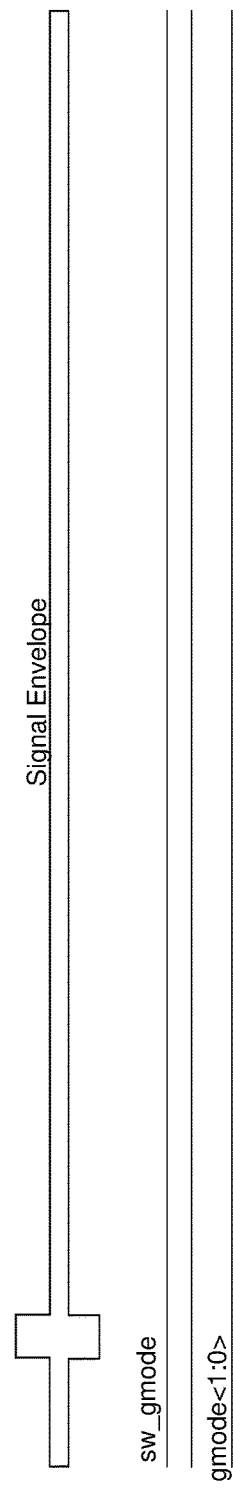
FIG. 16 illustrates a sixth timing diagram for class G control timing according to various signal conditions for the class G control system.

FIG. 16 illustrates an abrupt decrease in amplitude across one threshold, then an abrupt increase, so there is no change in the mode. That is, the decrease counter above never reached its end before the amplitude increase, so the mode did not change.

As mentioned above, the Class G control circuit 400 includes a low dropout voltage regulator 402, a controller 404, a comparator (not shown) to determine when the buck charge pump 402 has reached the desired value on falling transitions, and a non-overlap clock generator 406 to generate clock signals for both the buck charge pump 502 and charge pump inverter 504.

The low dropout linear voltage regulator 402 creates a local 1.2V supply for digital processing. The pup_ldo_hpreg level shifter shown in FIG. 3 is enabled by the pwrup signal, while all other level shifters are enabled by the output of the pup_hpreg level shift. The default state for all logic signals is zero, so the Class G control circuit 400 is initialized in the default logic state when pup_hpreg goes high.

The controller 404 is a semi-synchronous state machine for providing the graceful mode transitions of the buck converter 502. During initial power up of the converters and when increasing the supply voltage for the Class G operation, an eight bit shift register is used in the controller 404 to provide decreasing resistance of the switches 202 connected to the line supply. The resistance starts at a large value upon start up or a mode transition and is reduced at 16 μs intervals until the minimum switch resistance is selected. This feature limits the line current to reasonable values as the fly and hold capacitors 204 reach the desired voltage levels.

When reducing the supply voltage during Class G operation, the buck converter 502 clock is halted in the discharge state until the buck charge pump 502 output reaches the desired state. This reduces the line current to a low value and eliminates current from being injected back to the accessory power.

The controller 404 has a variety of different functions. One such function is a soft start enable feature that immediately starts switching with a high switch resistance to minimize surge current from the input line power since excessive stress on the input line power may disrupt system behavior. The buck charge pump 502 naturally draws a large current in startup and the soft start feature provides a more efficient method of powering the buck charge pump 502 at startup.

A synchronous divide by sixteen is used to provide the soft start and mode transition resistance intervals. The clock divider is clocked with the negative edge of the 1 MHz reference clock to provide at least 500 ns margin for all logic transitions. All flip flops are reset if the soft start feature is unused.

The soft start enable signals, en_soft_up and en_soft_dn, shown in FIG. 3, are static controls. The Class G direction signal gdir is provided by the controller 404 to indicate the direction of the transition of the buck converter 502 output VDDHP. Table 2 below shows the status of the soft start feature based on the en_soft_up and en_soft_dn signals.

TABLE 2

| en_soft_up | en_soft_dn | Soft Start Feature |
|---|---|---|
| 0 | 0 | Unused |
| 0 | 1 | No effect when increasing, eliminates negative line current when decreasing |
| 1 | 0 | Reduces surge current when increasing, no effect when decreasing |
| 1 | 1 | Reduces surge current when increasing, eliminates negative line current when decreasing |

The synchronizer (not shown) of the controller 404 acquires a positive change of sw_gmode, the signal which initiates a class G mode transition, as discussed above. Two flip flops triggered on the positive edge of the 1 MHz clock are used to prevent metastability. A third flip flop synchronizes the mode transition to the positive edge of the divide by sixteen clock mentioned above, which rises on the negative edge of the 1 MHz clock. The ldzb (load zero bar) signal goes low at least 500 ns before the synchronized rising edge of the divided clock and returns high immediately after the rising edge of the divided clock. This signal initializes the state machine for increasing Class G transitions.

The controller 404 also includes a shift register to generate 16 μs intervals for controlling the resistance of the switches 202 in the buck converter 502. The outputs of the generator are low to indicate higher resistance and are high for reduced resistance. All signals are synchronized to the divided clock. The soft start feature is enabled if en_soft is high.

The controller 404 also includes a function to disable the buck converter 502 non overlap clock during decreasing Class G transitions. Disabling the buck non-overlap clock 406 is synchronized with the divided clock which occurs on the negative edge of the clklm signal. This is when the converters in the buck charge pump 502 are switching to the discharging phase φ2, so the buck charge pump 502 is disconnected from the line. This prevents current from being injected back into the line as the hold capacitor is discharged. Since the hold capacitor supplies the positive headphone amplifier current as the supply voltages drop and the quiescent current of the buck switch drivers is eliminated, maximum efficiency is achieved.

When the output of the buck charge pump 502 VDDHP reaches the desired level, the signal VDDHP_lo goes high. On the next positive edge of the clklm signal, the buck non-overlap clock 406 is re-enabled and the converter switches to the charging phase φ1.

The non-overlap clock signal for the buck charge pump 502 from the non-overlap clock 406 is disabled in mode 00 until a synchronized soft start is enabled in mode φ1. The inverter non-overlap clock signal from the non-overlap clock 406 continues to run throughout the negative Class G transition while the buck converter non-overlap clock is disabled. This allows the charge pump inverter 504 to continue to track the buck converter 502 during the mode transition.

If the soft start feature is enabled, the Class G mode transition is synchronized with the resistance reduction signals and the 1 MHz clock. If soft start is disabled, the Class G mode control signals bypass the flip flops of the resistance reduction signals.

The comparator (not shown) of the Class G control circuit 400 indicates when the output of the buck converter 502, VDDHP, has reached the desired level. The reference is a three to one divider from VDDHP when in 3:1 mode and a two to one divider otherwise. The output of the comparator is high if VDDHP is above the reference. The charge pump inverter 504 translates the logic to 1.2V and a high at vddhp_lo indicates that the buck converter 502 output VDDHP is below the desired value.

The Class G control circuit 400 also includes a ripple counter (not shown) with a selectable output to provide 1/1, ½, ¼, and ⅛ clock rates to the non-overlap generator 406. The clock divider should be configured to divide by 1 MHz during start up and Class G mode transitions. The lower clock rates are provided to reduce quiescent current during standby with no load, or for low load applications such as line out.

The non-overlap clock generator 406 of the Class G control circuit 400 controls the charge phases φ1 and φ2.

The non-overlap clock generator 406 includes a programmable delay cell to set the non overlap time. A simple non-inverting multiplexer is provided for choosing the desired delay tap. Both the input and output of the delay cell are buffered to minimize linearity errors because of unit-to-unit loading. With double buffering, the unit cell is non-inverting and simplifies the programmable delay cell.

Returning to FIG. 1, as discussed above, the latency of the interpolator 100 provides enough lead time for the Class G control circuit 400 to predict the signal level at the amplitude and increase the Class G regulator 500 mode to avoid clipping. However, when the ANC 300 is used, as shown in FIG. 1, the input signal is processed with very little delay so there is not enough time for the Class G regulator 500 to transition to the required mode.

The Class G control circuit 400 has two amplitude inputs: the audio input and the ANC output. Ideally, the ANC output signal is a delayed signal plus the ANC generated signal noise. If latency is not considered, the ANC output signal, or just adding the ANC generated signal, is enough latency for the Class G control circuit 400. Because of latency, the future ANC noise values must be estimated.

The Class G control circuit 400 supports four modes: (1) a mode when ANC generated signal noise is ignored and only the input signal is used for control; (2) a mode when current noise value only, where the input signal+noise*C is used for control and C is the ANC margin constant; (3) a mode when only noise peak is used, where the input signal+the noise peak*C is used for control, where C is the ANC margin constant and noise peak is the maximal noise amplitude since the last peak reset; and (4) a combined current noise and peak, when the input signal+the noise*C+ noise peak is used for control.

If ANC 300 is not active, the first mode is chosen. If ANC 300 is active, for a typical environment, mode 2 would suffice. To perform these modes, the controller 404 includes peak registers to keep the maximal noise value since the last peak reset, the input signal peak and the ANC output signal peak. All three modes are readable by the Class G control circuit 400 for debugging and calibration purposes.

The ANC output signal is not used for the Class G control, but is used to trigger Class G interrupts. If the ANC output signal is more than ¾ of the full scale and the Class G mode is not 2, or the ANC output signal is more than ½ of the full scale and the Class G mode is not 1, overflow interrupt is generated.

Figure 17:
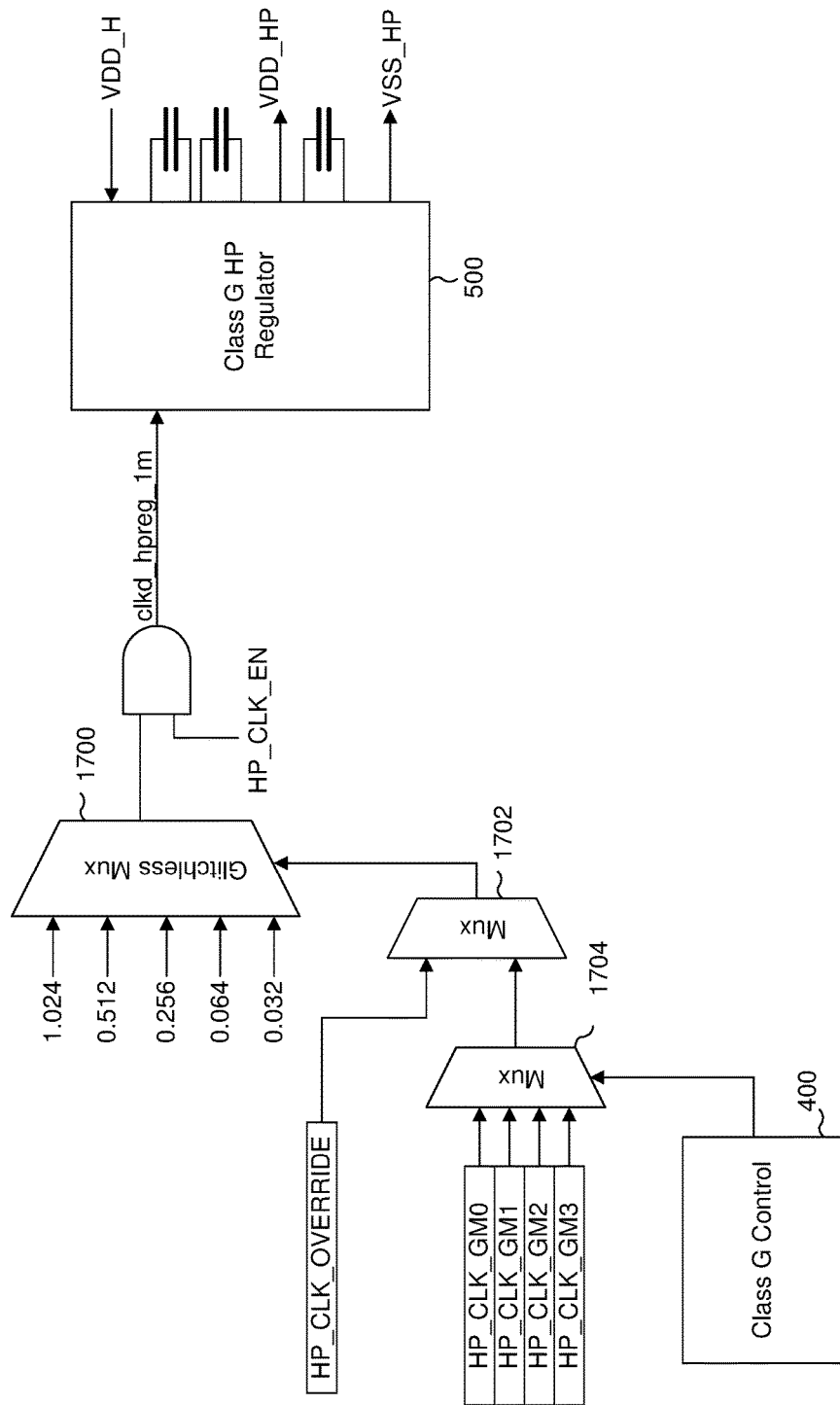
FIG. 17 illustrates a block diagram of the clock generation.

FIG. 17 illustrates the non-overlap clock generator 406 circuit included in the Class G control circuit 400. The clock is normally 1 MHz but may be programmed down for power reduction. The clock is generated in the digital system and must be glitch-free to avoid unpredictable effects in the Class G regulator 400 circuitry. FIG. 17 shows a functional diagram of selecting one of 6 possible clock frequencies in the glitchless multiplexer 1700, although a programmable frequency divider may also be used.

By default, the HP_CLK_OVERRIDE_EN inputted into multiplexer 1702 is high and the Class G regulator 500 frequency is determined by the value in the HP_CLK_OVERRIDE register, and by default the frequency is 1 MHz. When HP_CLK_OVERRIDE_EN is false, then the frequency is a function of the Class G operating mode. Associate with each of the four Class G operating modes is a 3 bit HP_CLK_CMx register that selects the Class G regulator 500 frequency for the 4 HP_CLK frequency registers.

By default, HP_CLK_EN is low and is set high to enable the Class G regulator 500.

Although the above discussed embodiments discuss the Class G control system with respect to a headphone system, the disclosed technology is not limited to such a system. The Class G control system above may be used with any Class G amplifier for any type of system to provide more efficient power supply to the Class G amplifier.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Also, when reference is made in this application to a method having two or more defined steps or operations, the defined steps or operations can be carried out in any order or simultaneously, unless the context excludes those possibilities.

Furthermore, the term "comprises" and its grammatical equivalents are used in this disclosure to mean that other components, features, steps, processes, operations, etc. are optionally present. For example, an article "comprising" or "which comprises" components A, B, and C can contain only components A, B, and C, or it can contain components A, B, and C along with one or more other components.

Also, directions such as "right" and "left" are used for convenience and in reference to the diagrams provided in figures. But the disclosed subject matter may have a number of orientations in actual use or in different implementations. Thus, a feature that is vertical, horizontal, to the right, or to the left in the figures may not have that same orientation or direction in all implementations.

Although specific embodiments of the invention have been illustrated and described for purposes of illustration, it will be understood that various modifications may be made without departing from the spirit and scope of the invention. Accordingly, the invention should not be limited except as by the appended claims.

The invention claimed is:

1. A Class G amplifier system, comprising:
a processing unit configured to receive an input signal and output a delayed processed input signal;
a class G amplifier configured to receive the delayed processed input signal; and
a power supply, including:
a regulator configured to operate in a plurality of configurations, wherein each configuration outputs a different supply voltage to the class G amplifier, the regulator including a multi-mode buck charge pump and a charge pump inverter; and
a control circuit configured to:
receive the input signal and determine the supply voltage required from the regulator when the delayed processed input signal is received at the class G amplifier,
output a signal to the regulator to indicate the required configuration for the required supply voltage, and
determine if soft start up is enabled and modify a switching resistance of switches in the buck charge pump based on the soft start up enablement.

2. The Class G amplifier system of claim 1, in which the control circuit is configured to determine the supply voltage required at the regulator based on an amplitude of the received input signal.

3. The Class G amplifier system of claim 1, in which the regulator is a digital regulator.

4. The Class G amplifier system of claim 3, in which the control circuit is configured to determine the supply voltage required at the regulator based on an amplitude of the received input signal.

5. A Class G amplifier system, comprising:
a processing unit configured to receive an input signal and output a delayed processed input signal, the processing unit including an interpolator and an active noise cancellation device;
a class G amplifier configured to receive the delayed processed input signal; and
a power supply, including:
a regulator configured to operate in a plurality of configurations, each configuration outputs a different supply voltage to the class G amplifier; and
a control circuit configured to receive the input signal and determine the supply voltage required from the regulator when the delayed processed input signal is received at the class G amplifier, and output a signal to the regulator to indicate the required configuration for the required supply voltage.

6. The Class G amplifier system of claim 5, in which the control circuit is configured to determine the supply voltage required at the regulator based on an amplitude of the received input signal.

7. The Class G amplifier system of claim 5, in which the regulator is a digital regulator.

8. The Class G amplifier system of claim 7, in which the control circuit is configured to determine the supply voltage required at the regulator based on an amplitude of the received input signal.

9. A method for providing power to a Class G amplifier, comprising:
receiving an input signal at a controller;
receiving the input signal at a processing unit and processing the input signal into a processed input signal;

determining an amplitude of the input signal and a voltage needed to operate the Class G amplifier based on the amplitude of the input signal;

setting a regulator to output the voltage needed to operate the Class G amplifier prior to the Class G amplifier receiving the processed input signal; and determining if a soft start up is enabled and modifying a switching resistance of switches in a buck charge pump of the regulator based on the soft start up enablement.

10. The method of claim 9, in which processing the input signal includes processing the input signal in an interpolator.

11. The method of claim 10, in which processing the input signal further includes processing the input signal in an active noise cancellation device.

12. A power supply for a Class G amplifier, including:
a regulator configured to operate in a plurality of configurations, each configuration outputs a different supply voltage to the Class G amplifier, wherein the regulator includes a multi-mode buck charge pump and a charge pump inverter; and a control circuit configured to:
receive the input signal and determine the supply voltage required from the regulator when a processed input signal is received at the class G amplifier,
output a signal to the regulator to indicate the required configuration for the required supply voltage; and
determine if soft start up is enabled and modify a switching resistance of switches in the buck charge pump based on the soft start up enablement.

13. The power supply of claim 12, in which the control circuit is configured to determine the supply voltage required at the regulator based on an amplitude of the received input signal.

14. The power supply of claim 12, in which the regulator is a configurable discrete regulator.

15. The power supply of claim 14, in which the control circuit is configured to determine the supply voltage required at the regulator based on an amplitude of the received input signal.

* * * * *